US012725660B2

(12) United States Patent
Chou et al.

(10) Patent No.: US 12,725,660 B2
(45) Date of Patent: Sep. 1, 2026

(54) WRITING METHOD, READING METHOD AND MEMORY DEVICE FOR HIDING DATA

(71) Applicant: MACRONIX International Co., Ltd., Hsinchu (TW)

(72) Inventors: You-Liang Chou, Taichung City (TW); Wen-Jer Tsai, Hualien County (TW); Chun-Chang Lu, Hsinchu City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 106 days.

(21) Appl. No.: 18/914,336

(22) Filed: Oct. 14, 2024

(65) Prior Publication Data

US 2026/0105963 A1 Apr. 16, 2026

(51) Int. Cl.
*G11C 16/10* (2006.01)
*G11C 16/12* (2006.01)
*G11C 16/16* (2006.01)

(52) U.S. Cl.
CPC ............ *G11C 16/102* (2013.01); *G11C 16/12* (2013.01); *G11C 16/16* (2013.01)

(58) Field of Classification Search
CPC ........ G11C 16/102; G11C 16/12; G11C 16/16
See application file for complete search history.

(56) References Cited

U.S. PATENT DOCUMENTS 7,830,717 B2 11/2010 Won et al.
2007/0153574 A1 7/2007 Kouno
2024/0220142 A1* 7/2024 Park ...................... G06F 3/0679
2025/0095744 A1* 3/2025 Cui ...................... G11C 16/102
2025/0322878 A1* 10/2025 Dong ................ G11C 16/0483

OTHER PUBLICATIONS

Md Raquibuzzaman et al., "Hide-and-Seek: Hiding Secrets in Threshold Voltage Distributions of NAND Flash Memory Cells", HotStorage '23: Proceedings of the 15th ACM Workshop on Hot Topics in Storage and File Systems, Jul. 2023, pp. 80-86. (Year: 2023).*
Md Raquibuzzaman et al., "Hide-and-Seek: Hiding Secrets in Threshold Voltage Distributions of NAND Flash Memory Cells", HotStorage '23: Proceedings of the 15th ACM Workshop on Hot Topics in Storage and File Systems, Jul. 2023, pp. 80-86.
"Notice of allowance of Taiwan Counterpart Application", issued on Jul. 8, 2025, p. 1-p. 3.

* cited by examiner

*Primary Examiner* — Min Huang
(74) *Attorney, Agent, or Firm* — J.C. PATENTS

(57) ABSTRACT

A writing method and a reading method for hiding data in a memory device and a memory device thereof are provided. The memory device may be a 3D NAND flash with high capacity and high performance. The writing method includes: providing a memory block, each memory cell including an erase state and potential states, each potential state including a first and a second sub-potential states; performing a first program operation to move threshold voltages of a first portion in a specific page to the first sub-potential state; performing a second program operation to move threshold voltages of a second portion in the specific page to the second sub-potential state. The first program operation includes: applying a first pass voltage to a first word line of a first page, the first page is adjacent a side of the specific page; and, applying a second pass voltage to a second word line of a second page, the second page is adjacent another side of the specific page.

14 Claims, 16 Drawing Sheets

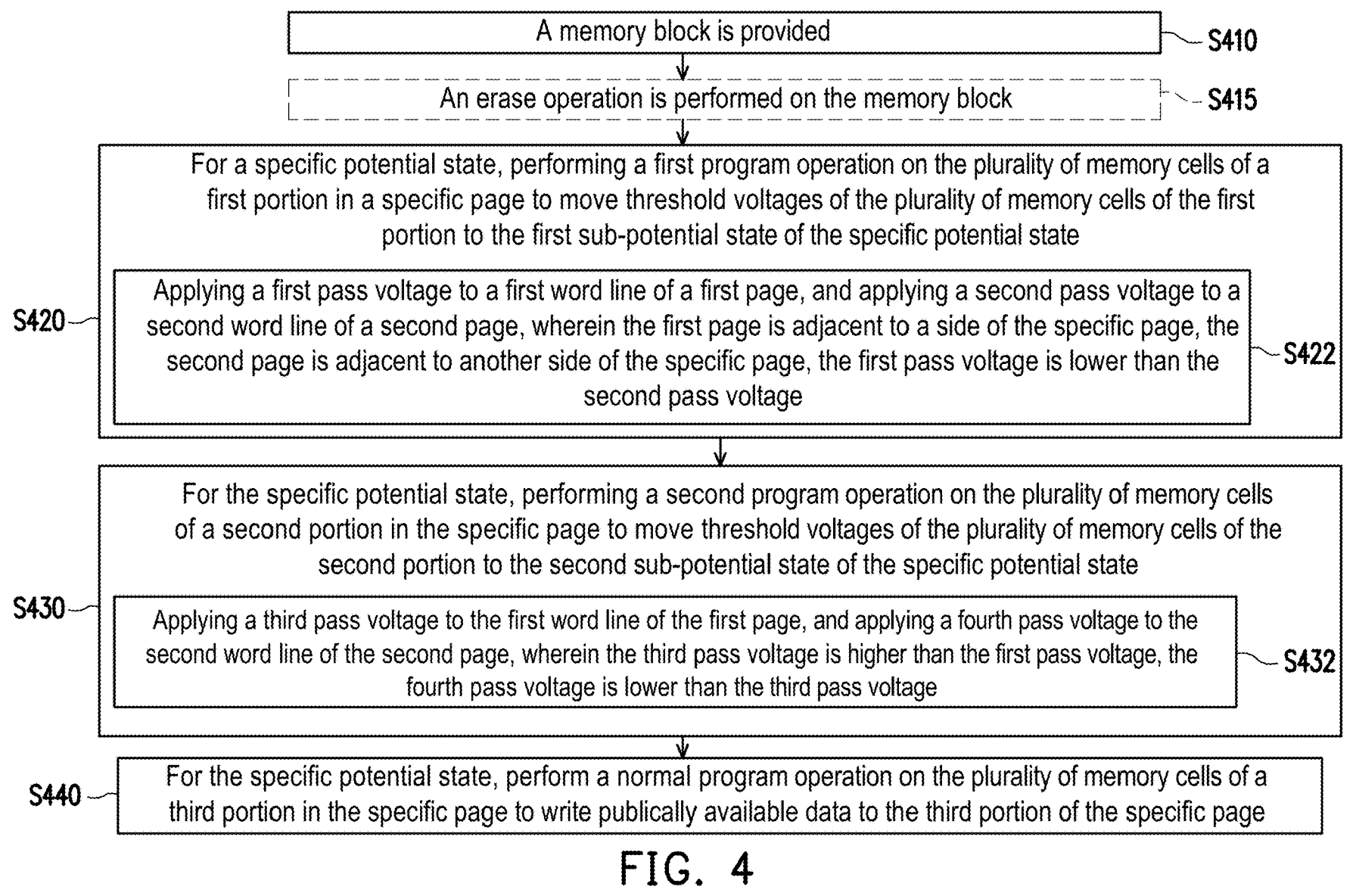

A memory block is provided — S410

An erase operation is performed on the memory block — S415

S420: For a specific potential state, performing a first program operation on the plurality of memory cells of a first portion in a specific page to move threshold voltages of the plurality of memory cells of the first portion to the first sub-potential state of the specific potential state S422: Applying a first pass voltage to a first word line of a first page, and applying a second pass voltage to a second word line of a second page, wherein the first page is adjacent to a side of the specific page, the second page is adjacent to another side of the specific page, the first pass voltage is lower than the second pass voltage S430: For the specific potential state, performing a second program operation on the plurality of memory cells of a second portion in the specific page to move threshold voltages of the plurality of memory cells of the second portion to the second sub-potential state of the specific potential state S432: Applying a third pass voltage to the first word line of the first page, and applying a fourth pass voltage to the second word line of the second page, wherein the third pass voltage is higher than the first pass voltage, the fourth pass voltage is lower than the third pass voltage S440: For the specific potential state, perform a normal program operation on the plurality of memory cells of a third portion in the specific page to write publically available data to the third portion of the specific page

FIG. 4

WRITING METHOD, READING METHOD AND MEMORY DEVICE FOR HIDING DATA

BACKGROUND

Technical Field

The present disclosure relates to a corresponding technology applied to a memory device (such as a NAND flash memory), and in particular to a writing method, a reading method and a memory device for hiding data.

Description of Related Art

High-capacity and high-performance integrated circuit memories having 3D NAND flash memory is under development in the hope of reducing the size of memory cells and increasing data storage density using 3D stacking technology and triple-level cells (TLC). On the other hand, data may be encrypted in different ways (for example, by adjusting the reading and writing methods of the memory device) to embed the hidden data (also referred to as secret data) into the memory device for storing publically available images or digital data, and to obtain the hidden data from the memory device through a corresponding decryption method, thereby protecting the hidden data, and such technology is called steganography.

Since data is hidden by adjusting the reading and writing methods of the memory device, the amount of data that may be hidden will be limited accordingly. On the other hand, the threshold voltage distribution corresponding to the value "0" or "1" will inevitably overlap each other during design, causing deterioration to the recovered hidden data. That is, errors might occur when a portion of bits in the hidden data are extracted. Therefore, when recovering hidden data, how to avoid or reduce errors when extracting bits is one of the issues to be solved.

SUMMARY

The present disclosure provides a writing method, a reading method and a memory device for hiding data in a memory device, which may reduce the bit error rate when extracting bits in the hidden data.

The present disclosure provides a writing method for hiding data in a memory device. The writing method includes: providing a memory block, wherein the memory block includes a plurality of memory cells, the plurality of memory cells are respectively connected to a plurality of word lines and are constructed as a plurality of pages, wherein each memory cell includes an erase state and a plurality of potential states, each potential state includes a first sub-potential state and a second sub-potential state for hiding hidden data; for a specific potential state among the plurality of potential states, performing a first program operation on a plurality of memory cells of a first portion in a specific page to move threshold voltages of the plurality of memory cells of the first portion to the first sub-potential state of the specific potential state, wherein the plurality of pages include the specific page; and, for the specific potential state, performing a second program operation on a plurality of memory cells of a second portion in the specific page to move threshold voltages of the plurality of memory cells of the second portion to the second sub-potential state of the specific potential state. The first program operation includes: applying a first pass voltage to a first word line of a first page of the plurality of pages, wherein the first page is adjacent to a side of the specific page; and, applying a second pass voltage to a second word line of a second page of the plurality of pages, wherein the second page is adjacent to another side of the specific page, wherein the first pass voltage is lower than the second pass voltage. The second program operation includes: applying a third pass voltage to the first word line of the first page, wherein the third pass voltage is higher than the first pass voltage; and, applying a fourth pass voltage to the second word line of the second page, wherein the fourth pass voltage is lower than the third pass voltage.

The present disclosure provides a memory device. The memory device includes a memory array and a memory controller. The memory array includes a memory block. The memory block includes a plurality of memory cells, the plurality of memory cells are respectively connected to a plurality of word lines and are constructed as a plurality of pages, wherein each memory cell includes an erase state and a plurality of potential states, each potential state includes a first sub-potential state and a second sub-potential state for hiding the hidden data. The memory controller is coupled to the memory array. The memory controller is configured to: for a specific potential state among the plurality of potential states, perform a first program operation to move threshold voltages of a plurality of memory cells of a first portion in a specific page to move threshold voltages of the plurality of memory cells of the first portion to the first sub-potential state of the specific potential state, wherein the plurality of pages comprise the specific page; and, for the specific potential state, perform a second program operation on a plurality of memory cells of a second portion of the specific page to move threshold voltages of the plurality of the memory cells of the second portion to the second sub-potential state of the specific potential state. The first program operation includes: applying a first pass voltage to a first word line of a first page of the plurality of pages, wherein the first page is adjacent to a side of the specific page; and, applying a second pass voltage to a second word line of a second page of the plurality of pages, wherein the second page is adjacent to another side of the specific page, wherein the first pass voltage is lower than the second pass voltage. The second program operation includes: applying a third pass voltage to the first word line of the first page, wherein the third pass voltage is higher than the first pass voltage; and, applying a fourth pass voltage to the second word line of the second page, wherein the fourth pass voltage is lower than the third pass voltage.

The present disclosure provides a reading method for hiding data in a memory device. The reading method includes: providing a memory block, wherein the memory block includes a plurality of memory cells, the plurality of memory cells are respectively connected to a plurality of word lines and are constructed as a plurality of pages, wherein each memory cell includes an erase state and a plurality of potential states, each potential state includes a first sub-potential state and a second sub-potential state for hiding the hidden data; performing a read operation for reading a plurality of memory cells in a specific page of the memory block. The read operation includes: applying a first read pass voltage to a first word line of a first page of the plurality of pages, wherein the first page is adjacent to a side of the specific page; and, applying a second read pass voltage to a second word line of a second page of the plurality of pages, wherein the second page is adjacent to another side of the specific page, wherein the first pass voltage is lower than the second pass voltage.

The present disclosure provides a memory device. The memory device includes a memory array and a memory controller. The memory array includes a memory block. The memory block includes a plurality of memory cells, the plurality of memory cells are respectively connected to a plurality of word lines and are constructed as a plurality of pages, wherein each memory cell includes an erase state and a plurality of potential states, each of the plurality of potential states includes a first sub-potential state and a second sub-potential state for hiding the hidden data. The memory controller is coupled to the memory array. The memory controller is configured to perform a read operation for reading a plurality of memory cells in a specific page of the memory block, wherein the plurality of pages comprise the specific page. The read operation includes applying a first read pass voltage to a first word line of a first page of the plurality of pages, wherein the first page is adjacent to a side of the specific page; and applying a second read pass voltage to a second word line of a second page of the plurality of pages, wherein the second page is adjacent to another side of the specific page, and the first pass voltage is lower than the second pass voltage.

Based on the above, according to the writing method and reading method of hiding data in a memory device and the memory device thereof in the embodiments of the present disclosure, by applying different levels of pass voltages to two pages adjacent to a specific page in the program operation of the writing method, it is possible to achieve denser threshold voltage distribution corresponding to the two sub-potential states used for hidden data in a specific potential state, thereby preventing the threshold voltage distribution corresponding to the aforementioned two sub-potential states from being exposed outside the threshold voltage distribution of a specific potential state. Moreover, in the reading method, by performing asymmetric read operations on two adjacent pages and the specific page, it is possible to make the aforementioned two sub-potential states further separate from each other, thereby reducing the bit error rate when extracting the hidden data.

BRIEF DESCRIPTION OF THE DRAWINGS

FIG. 4 is a flow chart of a writing method for hiding data in a memory device according to an embodiment of the present disclosure.

DESCRIPTION OF THE EMBODIMENTS

Figure 1:
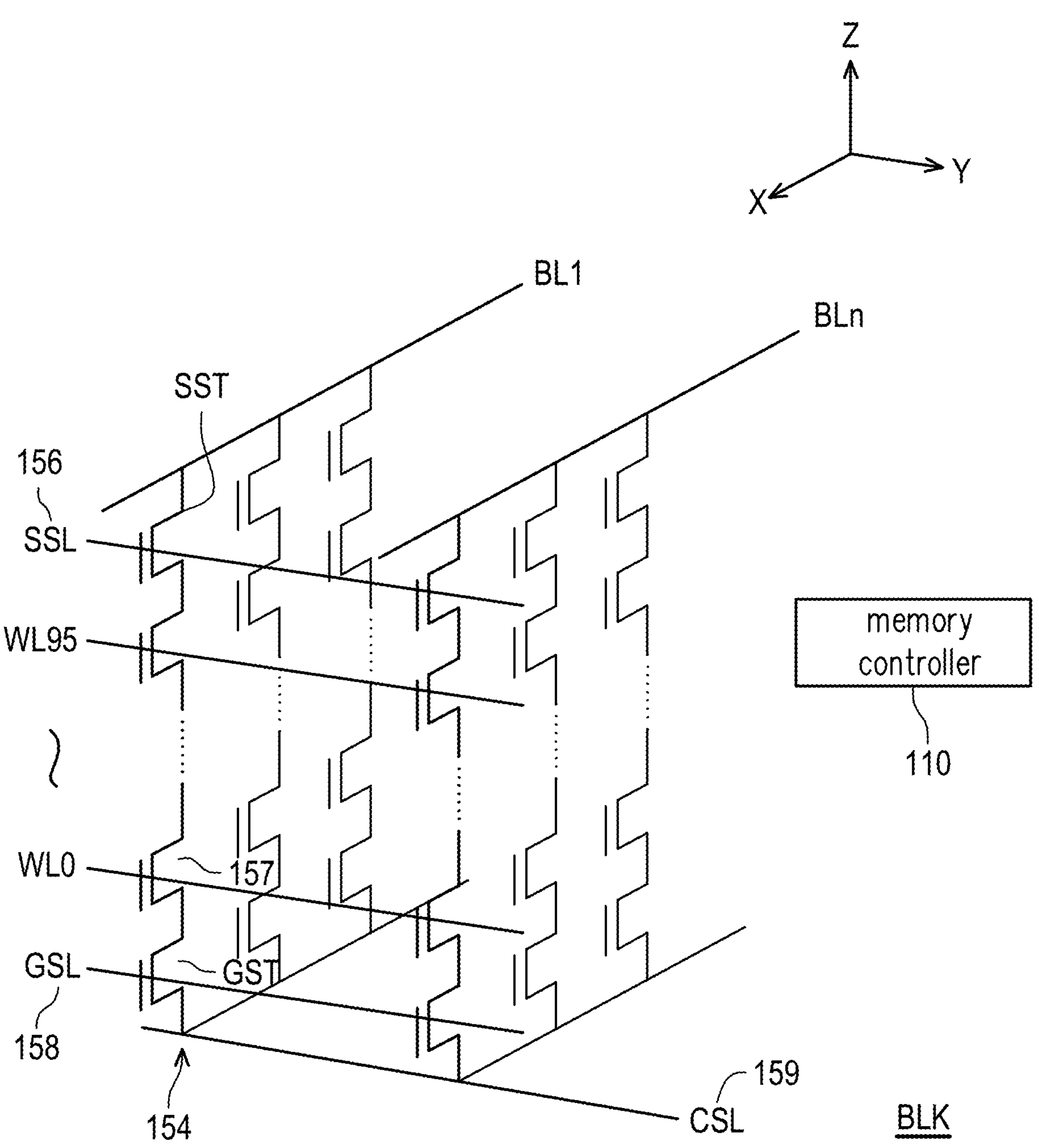
FIG. 1 is a schematic structural diagram of a memory block and a memory controller in a three-dimensional memory chip according to an embodiment of the present disclosure.
Figure 2:
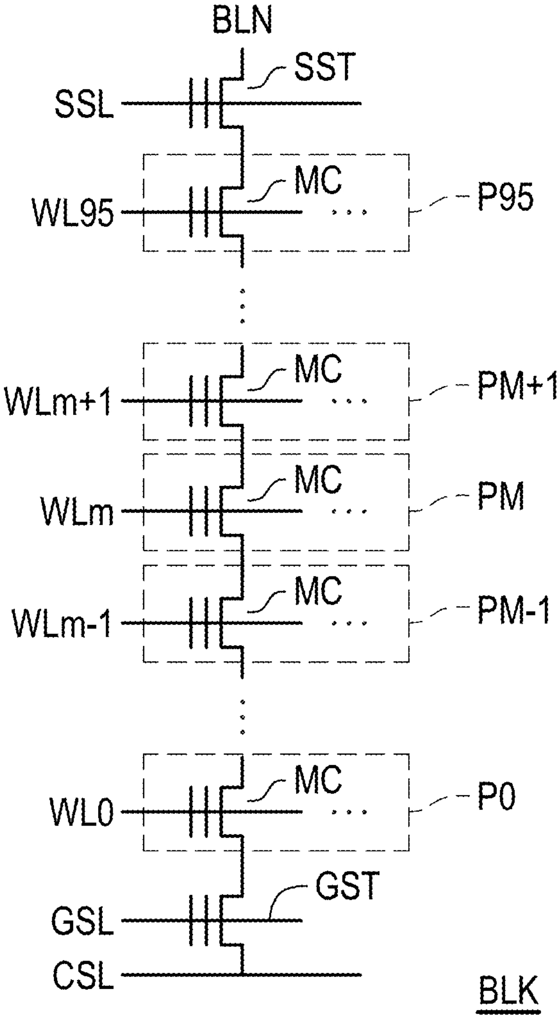
FIG. 2 is a schematic diagram of various pages (e.g., pages P0 to P95) in the memory block BLK according to an embodiment of the present disclosure.

FIG. 1 is a schematic structural diagram of a memory block BLK and a memory controller 110 in a three-dimensional memory chip according to an embodiment of the present disclosure. FIG. 2 is a schematic diagram of various pages (e.g., pages P0 to P95) in the memory block BLK according to an embodiment of the present disclosure. Please refer to FIG. 1 and FIG. 2 at the same time. The three-dimensional memory chip may include one or more memory blocks BLK. The memory block BLK includes a plurality of memory cells, a plurality of word lines WL0 to WL95 and bit lines BL1 to BLn. The memory cells are disposed in three dimensions, for example, the XYZ coordinate system. Taking the memory cell 157 in FIG. 1 as an example, the memory cell 157 is coupled to the corresponding word line WL0 and bit line BL1. FIG. 1 mainly shows the three-dimensional memory block BLK, and FIG. 2 mainly shows the structure of various pages (e.g., pages P0 to P95) in the memory block BLK.

Word lines (e.g., word lines WL0 to WL95) formed by conductive layers or word line layers and multiple memory cells coupled thereto are divided into multiple pages. Each page may be, for example, a plurality of memory cells in the XY plane and connected to the same word line. For example, the memory block BLK in FIG. 2 includes pages P0 to P95. Memory cells on the same layer (same page) may be coupled to the same word line (e.g., word line WL0 or WL95) and obtain corresponding word line voltages. Memory cells on different layers (different pages) are coupled to different word lines (e.g., word lines WL0 and WL95) and obtain different word line voltages. In other words, a page in the memory block BLK is composed of memories connected to one of the corresponding plurality of word lines (for example, one of the word lines WL0 to WL95) in the memory cell strings. Each page may be connected to a corresponding contact point in a driving circuit, such as a scan driver, through one of the word lines WL0 to WL95 coupled to the page. Each line has a corresponding voltage driver, and the voltage drivers may be controlled by the memory controller 110 or corresponding hardware. The plurality of memory cells in the memory cell string 154 in FIG. 1 belong to different pages.

Each memory cell string (e.g., memory cell string 154) in FIG. 1 includes a plurality of memory cells connected in series vertically along the Z direction. The memory cell string includes a plurality of memory cells (e.g., memory cell 157), a string selection transistor SST coupled to a string selection line SSL 156, and a ground selection transistor GST coupled to a ground selection line GSL 158. The memory cell string 154 is connected to one or more drivers, such as data drivers. The memory cell 157 is connected to a common source line CSL 159 via a ground selection transistor GST. The string selection line SSL 156 may be a conductive line or a conductive layer formed on top of each page (or word line layer). The memory block BLK may include multiple string selection lines SSL 156 on the top page. The ground selection line GSL 158 may be a conductive line or a conductive layer formed on the bottom of each page (or word line layer). The common source line CSL 159 may be a conductive layer or a plurality of conductive lines formed under the ground selection line GSL 158 and on the substrate of the three-dimensional memory chip. Several dummy lines or corresponding layers (not shown) may also be disposed between the string selection line SSL 156 and the uppermost page, or between the ground selection line GSL 158 and the lowermost page.

The memory device of the embodiment includes a memory array and a memory controller (e.g., the memory controller 110 in FIG. 1). The memory array may include one or more memory blocks BLK as described in FIG. 1. Each memory block includes a plurality of memory cells, and the plurality of memory cells are divided into a plurality of memory regions.

The memory cells in the memory block BLK belong to multi-level memory cells. A "multi-level memory cell" is, for example, one of a multi-level cell (MLC), a triple-level cell (TLC), and a quad level cell (QLC). The memory cells in the memory device and memory block BLK of this embodiment are triple-level cell (TLC) as an example.

Steganography hides and secretly embeds data into publically available digital data (e.g., images) by intentionally adding small distortions (e.g., small differences between threshold voltage distributions). It is assumed that the hacker is able to physically access the memory device and perform basic data storage, read and other operations. However, as long as the hacker does not know the secret key of the memory cell containing the hidden data and the exact storage location of the hidden data, the hacker will not be able to determine whether the hidden data exists, let alone extract the hidden data.

If steganography is implemented through a single-level memory cell, the size of the hidden data may only account for a small percentage of the total number of bits of the publically available data, for example, 5.64%. Moreover, when designing steganography, it is necessary to reduce the overlapped portion between threshold value distributions of the values "0" and "1" in the hidden data in the program operation, because the overlapped portion will deteriorate the extraction of secret data.

Based on the concept of asymmetric charges in the storage layer (such as a nitride layer) as a memory cell in a memory device, corresponding embodiments of the present disclosure provide a data hiding technology having an asymmetric program operation and an asymmetric read operation. Based on the corresponding technology of the embodiments of the present disclosure, the size of the hidden data relative to the publically available data may be enlarged (for example, the size of the hidden data may be 10.9% of the total number of bits of the publically available data). The embodiment of the present disclosure uses multi-level memory cells as the basis of data hiding technology. Therefore, in addition to the erase state, other potential states are available for hiding data. Taking TLC memory cell as an example, data may be hidden through 7 potential states. In the embodiment of the present disclosure, there are about less than ⅛ of the total number of bits in one page may be qualified to hide data through 7 potential states. In detail, since the erase state cannot hide data, there are about less than or equal to $7/64$($7/8$*$1/8$) of the total number of bits in one page may be qualified to hide data through 7 potential states.

Through asymmetric program operation, the values "1" and "0" of the threshold voltage distribution may better program the threshold voltage distribution of the hidden data and the sub distribution of the hidden data in an overlapping manner, so that the hidden data is well hidden within a dense threshold voltage distribution of the publically available data. In detail, the asymmetric program operation of the embodiment of the present disclosure may make the sub distributions of the hidden data having more overlapping for less program latency. Therefore, the program operation on hidden data may improve program latency due to larger program steps. On the other hand, the sub distribution of the hidden data may be easily identified through asymmetric read operation of the embodiment of the present disclosure. For example, this embodiment performs the read operation by pre-defining a specific reference voltage that is used to recover the hidden data and has an adaptive pass voltage, so there is no need to scan the threshold voltage distribution of the value "1"/"0" within a certain read voltage span, thereby reducing read latency.

In order to read (also referred to as, recover, extract) hidden data based on a specific location of the memory device, embodiments of the present disclosure adopt a shared secret key to let the memory controller know the bit position of the publically available data holding the aforementioned hidden data, and know how to read the hidden data. The embodiments of the present disclosure mainly focus on the writing method and the reading method of the hidden data. Therefore, each of the following embodiments is preset to be applied to the bit positions of the publically available data used for hiding the aforementioned hidden data.

Figure 3:
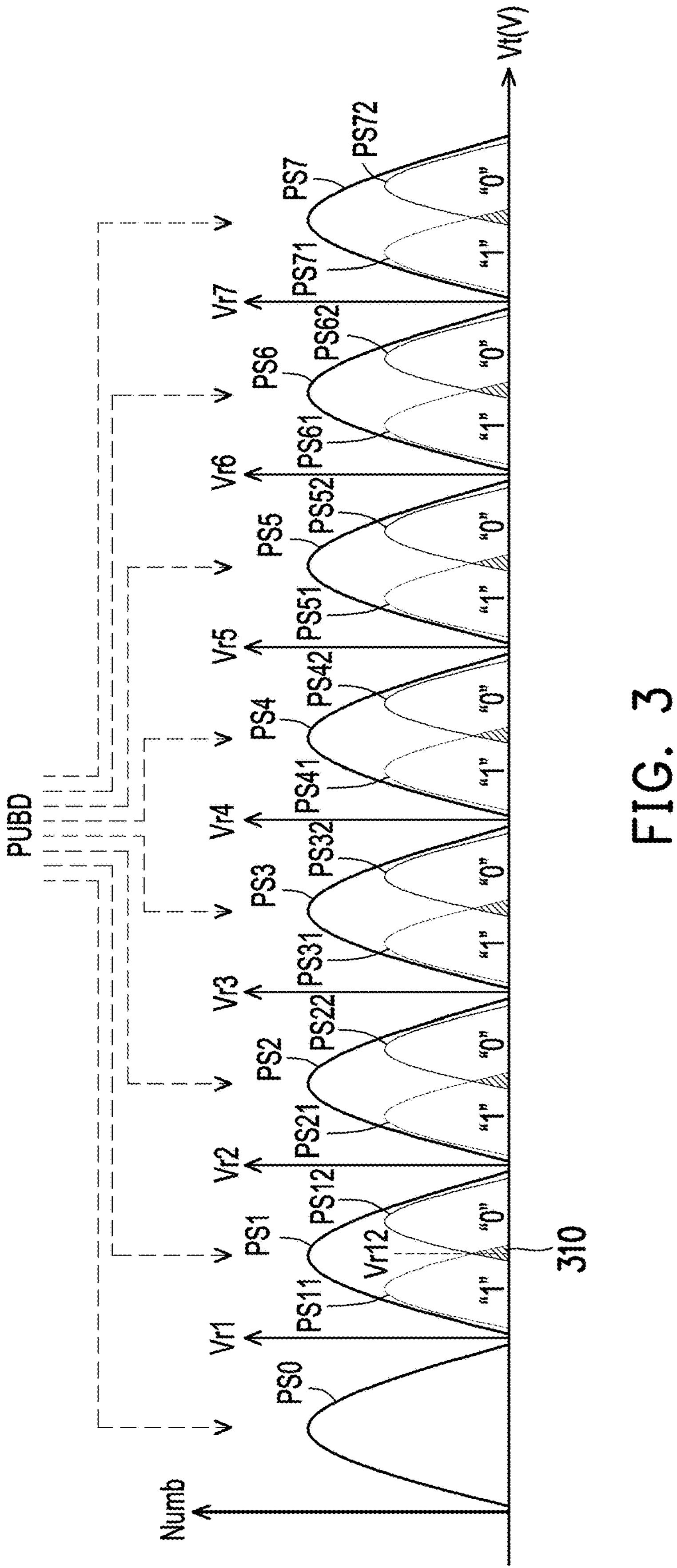
FIG. 3 is a schematic diagram of the threshold voltage distribution of publically available data and the sub distribution of hidden data according to an embodiment of the present disclosure.

FIG. 3 is a schematic diagram of the threshold voltage distribution of publically available data and the sub distribution of hidden data according to an embodiment of the present disclosure. FIG. 3 shows the threshold voltage distribution corresponding to the potential state of the memory cell presented as TLC in FIG. 1. The horizontal axis of FIG. 3 represents a threshold voltage Vt in a unit of voltage V. The vertical axis of FIG. 3 represents the number Numb of memory cells.

The memory cell in FIG. 1 includes the erase state PS0 in FIG. 3 and the potential states PS1 to PS7 in FIG. 3. The number of potential states PS1 to PS7 corresponds to multiple potential states of multi-level memory cells. For example, a multi-level cell (MLC) has 3 potential states in addition to the erase state PS0; a triple-level cell (TLC) has 7 potential states in addition to the erase state PS0; and a quad level cell (QLC) has 15 potential states in addition to the erase state PS0.

The threshold voltage distribution corresponding to the potential states PS1 to PS7 is adopted for performing write and read operations on publically available data PUBD. On the other hand, each potential state PS1 to PS7 includes first sub-potential states PS11 to PS71 and second sub-potential states PS12 to PS72 for hiding the hidden data. For example, in terms of the potential state PS1, if 1-bit of data is hidden in the publically available data, it means that one of the value "1" and the value "0" is implanted into the potential state PS1 of the publically available data. The hidden value "1" may be programmed via a program operation to a lower part of the threshold voltage distribution in the potential state PS1 relative to the publically available data, e.g., the first sub-potential state PS11. The hidden value "0" may be programmed via the program operation to a higher part of the threshold voltage distribution in the potential state PS1 relative to the publically available data, e.g., the second sub-potential state PS12. The sub-reference voltage Vr12 may be used to distinguish the first sub-potential state PS11 and the second sub-potential state PS12.

Embodiments of the present disclosure perform an asymmetric program scheme on a specific page (e.g., page PM) in the memory device shown in FIG. 1 and FIG. 2, thereby hiding data in the specific page (e.g., page PM). Memory cells in one page (for example, a page PM−1 or a page PM+1) adjacent to the specific page (e.g., page PM) must be in a lower threshold voltage (e.g., erase state PS0). Potential states PS1 to PS7 may be adopted for hiding data. That is, the voltage used to perform the program operation on the value "1" will be different from the voltage used to perform the program operation on the value "0".

For example, based on the top-to-bottom low threshold voltage state (such as the first embodiment and FIG. 5A and FIG. 5B), during the first program operation in the first sub-potential states PS11 to PS71, a higher program pass voltage is applied to the word line WLm−1 and a lower program pass voltage is applied to the word line WLm+1. When the second program operation in the second sub-potential states PS12 to PS72 is performed, a higher program pass voltage is applied to the word line WLm+1 and a lower program pass voltage is applied to the word line WLm−1.

Or, based on the bottom-to-top low threshold voltage state (such as the third embodiment and FIG. 11A and FIG. 11B), during the first program operation in the first sub-potential states PS11 to PS71, a higher program pass voltage is applied to the word line WLm+1 and a lower program pass voltage is applied to the word line WLm−1. When the second program operation in the second sub-potential states PS12 to PS72 is performed, a higher program pass voltage is applied to the word line WLm−1 and a lower program pass voltage is applied to the word line WLm+1.

Compared with the sub-potential states PS11 to PS71 and PS12 to PS72 of the hidden data, the publically available data that undergoes normal program operation (for example, the program pass voltage is equal to 10V or other values) adopts a larger voltage step to achieve a wider threshold voltage distribution. In contrast, asymmetric programmed voltage steps used to hide data will require smaller voltage differences to obtain a dense threshold voltage distribution. Compared with other technology, the embodiment of the disclosure can still have a larger voltage step or a larger voltage difference, so the embodiment of the disclosure has less program latency than other technologies for writing hidden data.

The secret key may record a specific reference voltage (e.g., sub-reference voltage Vr12 in FIG. 3) to distinguish the value "1" from the value "0" of the hidden data.

On the other hand, in addition to the specific reference voltage (such as the sub-reference voltage Vr12 in FIG. 3) used to read the hidden data, the embodiment of the present disclosure further adjusts the read pass voltage to achieve an asymmetrical read operation. For example, for the value "0", this embodiment applies a lower read pass voltage to the word line of the first page or the second page, and the aforementioned first page or second page is a page adjacent to the specific page subject to the program operation. In this way, the threshold voltage distribution corresponding to the value "0" in a specific page may be moved upward, so as to separate the value "1" from the value "0" on the threshold voltage distribution. Please see the following embodiments for detailed description.

FIG. 4 is a flow chart of a writing method for hiding data in a memory device according to an embodiment of the present disclosure. The writing method in FIG. 4 is applicable to a memory device including a memory array and a memory controller 110. The memory array includes a memory block BLK, as shown in FIG. 1 and FIG. 2.

In step S410 of FIG. 4, a memory block BLK is provided, as shown in FIG. 1 and FIG. 2. The memory block BLK includes a plurality of memory cells. The memory cells are respectively connected to multiple word lines (e.g., word lines WL0 to WL95) and are constructed as multiple pages (e.g., pages P0 to P95). Each memory cell includes an erase state (e.g., erase state PS0 in FIG. 3) and multiple potential states (e.g., potential states PS1 to PS7 in FIG. 3). Each potential state includes a first sub-potential state (e.g., potential states PS11 to PS71 in FIG. 3) and a second sub-potential state (e.g., potential states PS12 to PS72 in FIG. 3) for hiding hidden data.

In step S415 of FIG. 4, the memory controller 110 performing an erase operation on the memory block before performing program operations (e.g., the first program operation, the second program operation and the normal program operation) on the specific page.

In step S420 of FIG. 4, the memory controller 110 controls a specific potential state among the plurality of potential states PS1 to PS7 (this embodiment uses the potential state PS1 as a specific potential state), and performs a first program operation on the plurality of memory cells of the first portion in the specific page (e.g., page PM in FIG. 2) to move the threshold voltage of the plurality of memory cells of the first portion to the first sub-potential state PS11 of the specific potential state (potential state PS1). For ease of explanation, here, page PM in FIG. 2 is referred to as a specific page, and pages P0 to P95 include a specific page PM. In FIG. 2, each page P0 to P95 is coupled to the corresponding word lines WL0 to WL95 respectively. For example, the page PM is coupled to the word line WLm; the page PM−1 is coupled to the word line WLm−1; and the page PM+1 is coupled to the word line WLm+1. The memory cells MC in the page PM are all coupled to the word line WLm, and so on. For example, the memory cells MC in the page PM+1 are all coupled to the word line WLm+1.

Step S420 mainly includes step S422. In step S422 of FIG. 4, the memory controller 110 applies the first pass voltage to the first word line of the first page through corresponding hardware (e.g., voltage driver), and, the memory controller 110 applies the second pass voltage to the second word line of the second page through corresponding hardware. The first page is adjacent to a side of the specific page PM. The second page is adjacent to another side of the specific page PM. The first pass voltage is lower than the second pass voltage. For details of steps S420, please refer to the corresponding embodiments of FIG. 5A and FIG. 11A.

In step S430 of FIG. 4, for a specific potential state (e.g., potential state PS1), the memory controller 110 executes a second program operation on the plurality of memory cells of the second portion in the specific page (e.g., page PM of FIG. 2) to move the threshold voltages of the plurality of memory cells of the second portion to the second sub-potential state PS12 of a specific potential state (potential state PS1). Step S430 mainly includes step S432. In step S432 of FIG. 4, the memory controller 110 applies the third pass voltage to the first word line of the first page through corresponding hardware (e.g., voltage driver), and, the memory controller 110 applies the fourth pass voltage to the second word line of the second page through corresponding hardware. The third pass voltage is higher than the first pass voltage. The fourth pass voltage is lower than the third pass voltage. For details of steps S430, please refer to the corresponding embodiments of FIG. 5B and FIG. 11B.

In step S440 of FIG. 4, for a specific potential state (e.g., potential state PS1), the memory controller 110 performs normal program operations on the plurality of memory cells of the third portion of the specific page PM to write the publically available information to the third portion in the specific page PM. In other words, this embodiment writes the first value (e.g., value "0") and the second value (e.g., value "1") of the hidden data into the first portion and the second portion in the specific page PM through corresponding program operations (steps S420 and S430), and then write the publically available information into the third portion of the specific page PM through normal program operations.

The aforementioned first, second and third portions may be set accordingly according to the requirements for applying this embodiment. This embodiment does not limit how to divide the aforementioned first, second and third portions. Please refer to FIG. 3. For convenience of illustration, the number of memory cells corresponding to the potential state PS1 in this embodiment includes the memory cells of the first, second and third portions. The number of memory cells corresponding to the first sub-potential state PS11 includes the memory cells of the first portion, and the number of memory cells corresponding to the second sub-potential state PS12 includes the memory cells of second portion. There is an overlapped portion 310 between the first sub-potential state PS11 and the first sub-potential state PS12.

Figure 5A:
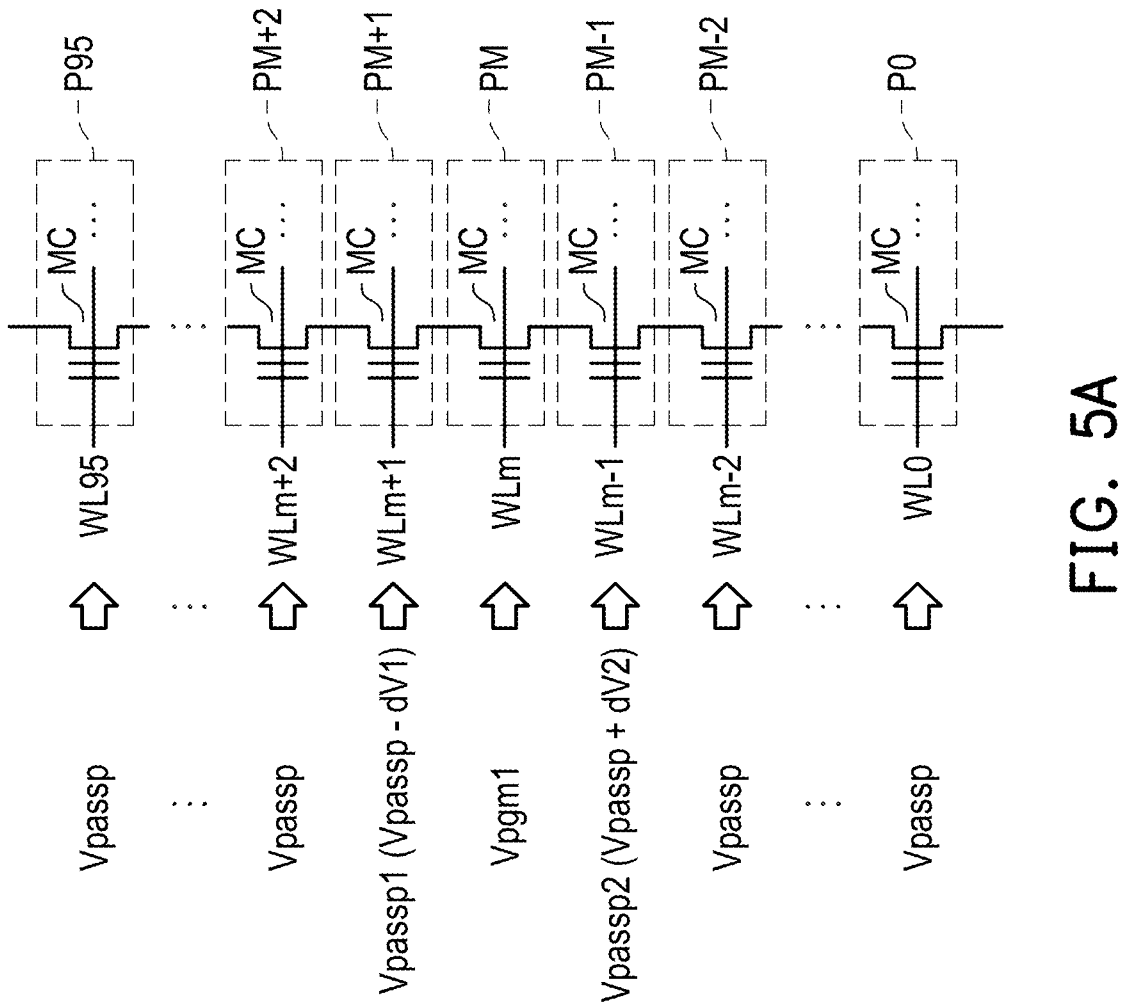
FIG. 5A and FIG. 5B are respectively schematic diagrams showing step S420 and step S430 of FIG. 4 in the first embodiment of the present disclosure.
Figure 5B:
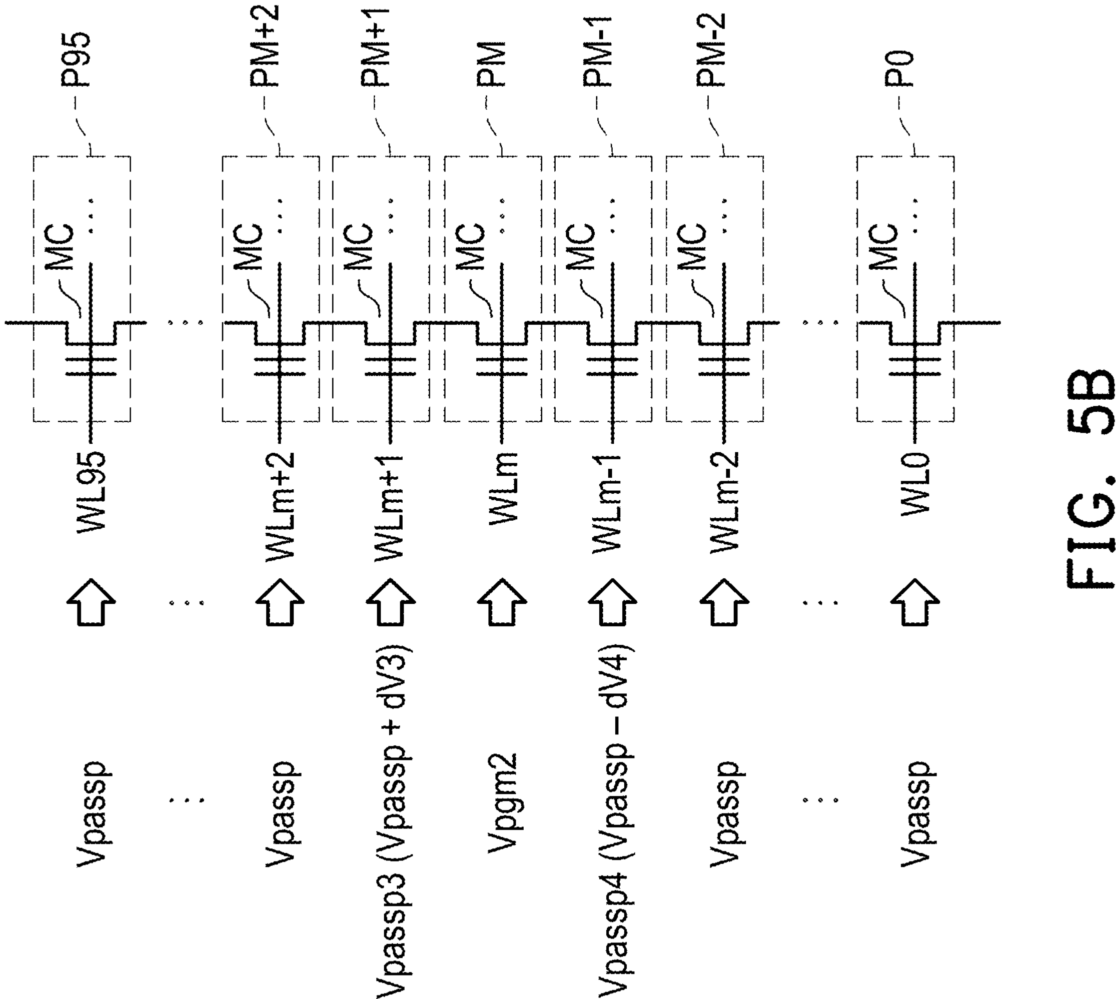

FIG. 5A and FIG. 5B are respectively schematic diagrams showing step S420 and step S430 of FIG. 4 in the first embodiment of the present disclosure. Referring to FIG. 5A corresponding to step S420, for a specific potential state, a first pass voltage Vpassp1 is applied to the first word line WLm+1 of the first page (e.g., page PM+1), and a second pass voltage Vpassp2 is applied to the second word line WLm−1 of the second page (e.g., page PM−1), and the first pass voltage Vpassp1 is lower than the second pass voltage Vpassp2. The first page (page PM+1) is adjacent to a side of the specific page PM, and the second page (page PM−1) is adjacent to another side of the specific page PM. The first pass voltage Vpassp1 is a voltage obtained by subtracting the first voltage difference dV1 from the pass voltage Vpassp. The second pass voltage Vpassp2 is a voltage obtained by adding the second voltage difference dV2 to the pass voltage Vpassp. In this embodiment, the first voltage difference dV1 may be any voltage between 0.1V and 10V, and the second voltage difference dV2 may be any voltage between 0.1V and 5V.

In FIG. 5A, the first program voltage Vpgm1 is also applied to the word line WLm of the specific page PM. The first program voltage Vpgm1 is set according to the first sub-potential state PS11 of the specific potential state PS1. Moreover, the pass voltage Vpassp is applied to other pages (e.g., pages P0 to PM−2, PM+2 to P95).

Referring to FIG. 5B corresponding to step S430, for a specific potential state, the third pass voltage Vpassp3 is applied to the first word line WLm+1 of the first page (page PM+1), and the fourth pass voltage Vpassp4 is applied to the second word line WLm−1 of the second page (e.g., page PM−1), and the third pass voltage Vpassp3 is higher than the first pass voltage Vpassp1. The third pass voltage Vpassp3 is a voltage obtained by adding the third voltage difference dV3 to the pass voltage Vpassp. The fourth pass voltage Vpassp4 is the voltage obtained by subtracting the fourth voltage difference dV4 from the pass voltage Vpassp. In this embodiment, the third voltage difference dV3 is 0.1V to 5V, and the fourth voltage difference dV4 is 0.1V to 10V. In FIG. 5B, a second program voltage Vpgm2 is also applied to the word line WLm of the specific page PM. The second program voltage Vpgm2 is set according to the second sub-potential state PS12 of the specific potential state PS1. Moreover, the pass voltage Vpassp is applied to other pages (e.g., pages P0 to PM−2, PM+2 to P95).

Figure 6:
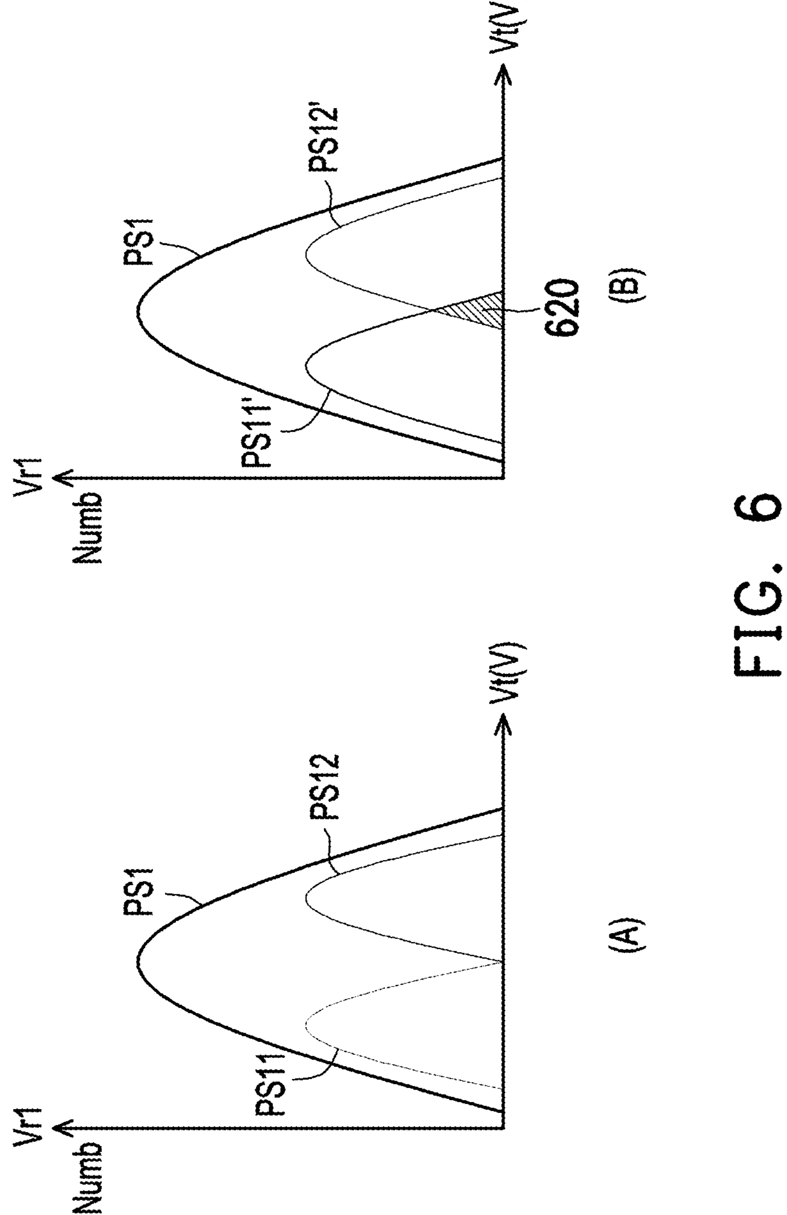
FIG. 6 is a schematic diagram illustrating the sub-potential states PS11 and PS12 after performing the writing method in FIG. 4.

FIG. 6 is a schematic diagram illustrating the sub-potential states PS11 and PS12 after the writing method in FIG. 4. In other technology for hiding data with the left portion (A) of FIG. 6, it may use a smaller voltage step (e.g., the voltage step in the left portion (A) of FIG. 6 is 0.1V) to make the sub-potential states PS11 and PS12 each have tightened threshold voltage distributions, thus there is no overlapped portion of the sub-potential states PS11 and PS12. And, in the embodiment of the disclosure, it may use a larger voltage step (e.g., the voltage step in the right portion of FIG. 6 is 0.2V) to make the sub-potential states PS11' and PS12' having some overlapped portion (e.g., marked 620). The reason is that, the asymmetric read operation in the embodiment of the disclosure may move the sub-potential states PS11' and PS12' to make the overlapped portion (e.g., marked 620) smaller, or even make the sub-potential states PS11' and PS12' having no overlap area after the asymmetric read operation in the embodiment of the disclosure.

Figure 7:
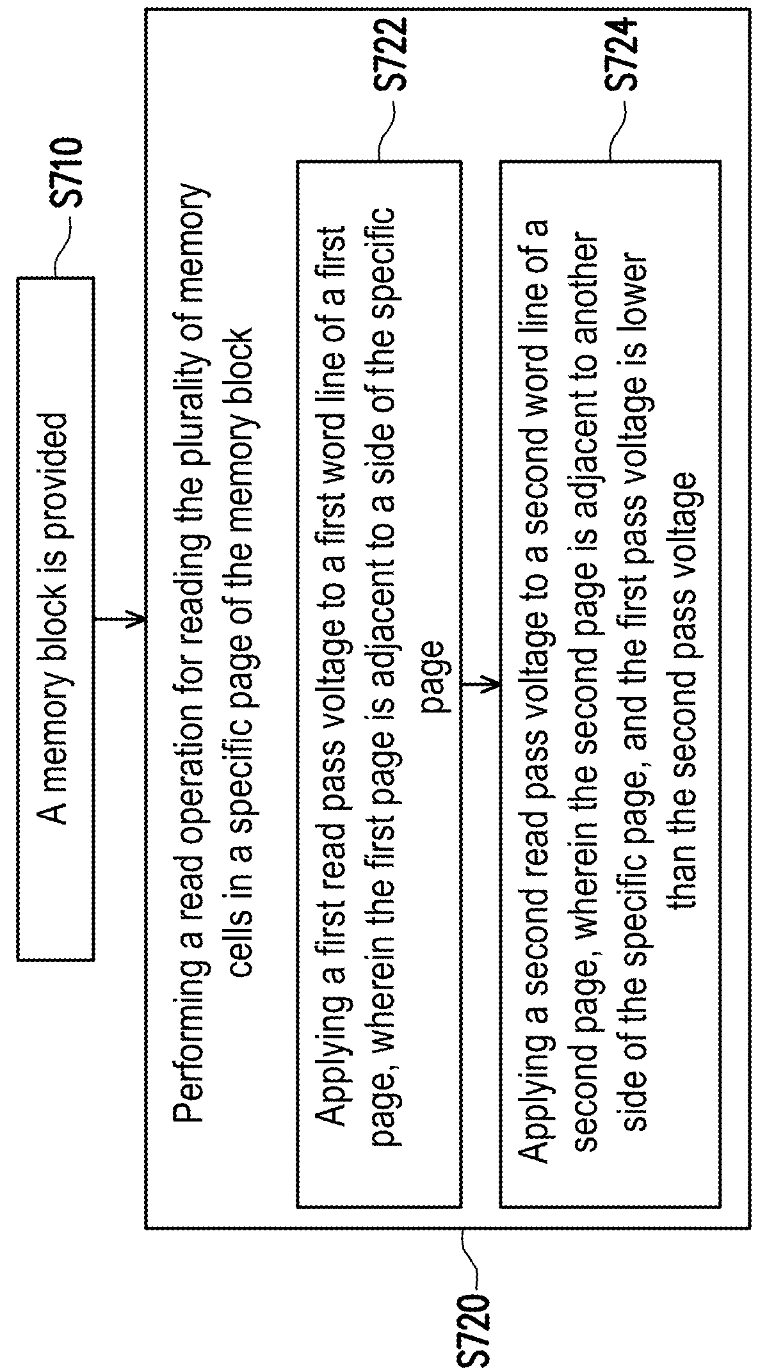
FIG. 7 is a flow chart of a reading method for hiding data in a memory device according to an embodiment of the present disclosure.

FIG. 7 is a flow chart of a reading method for hiding data in a memory device according to an embodiment of the present disclosure. The reading method in FIG. 7 is applicable to a memory device including a memory array and a memory controller 110. The memory array includes a memory block BLK, as shown in FIG. 1 and FIG. 2.

In step S710 of FIG. 7, a memory block BLK is provided, as shown in FIG. 1 and FIG. 2. The memory block BLK includes a plurality of memory cells. The memory cells are respectively connected to multiple word lines (e.g., word lines WL0 to WL95) and are constructed as multiple pages (e.g., pages P0 to P95). Each memory cell includes an erase state (e.g., erase state PS0 in FIG. 3) and a plurality of potential states (e.g., potential states PS1 to PS7 in FIG. 3). Each potential state includes a first sub-potential state (e.g., potential states PS11 to PS71 in FIG. 3) and a second sub-potential state (e.g., potential states PS12 to PS72 in FIG. 3) for hiding hidden data.

In step S720 of FIG. 7, the memory controller 110 performs a read operation. The read operation is provided to read a plurality of memory cells in a specific page (e.g., page PM in FIG. 2) of the memory block BLK. Step S720 mainly includes step S722 and step S724. In step S722 of FIG. 7, the memory controller 110 applies the first read pass voltage to the first word line of the first page through corresponding hardware. In step S724 of FIG. 7, the memory controller 110 applies the second read pass voltage to the second word line of the second page through corresponding hardware. The first read pass voltage is lower than the second read pass voltage.

Step S720 also includes sequentially applying a plurality of read voltages Vread to the specific word line WLM of the specific page PM. The read voltages Vread are set according to the first sub-potential states PS11 to PS71 and the second sub-potential states PS12 to PS72 in each of the potential states PS1 to SP7. Specifically, the read voltages Vread in this embodiment may be multiple voltage steps, so as to determine the data hidden in the memory cells in the specific pages PM one by one. For details of step S722 and step S724, please refer to the corresponding embodiments of FIG. 8.

Figure 8:
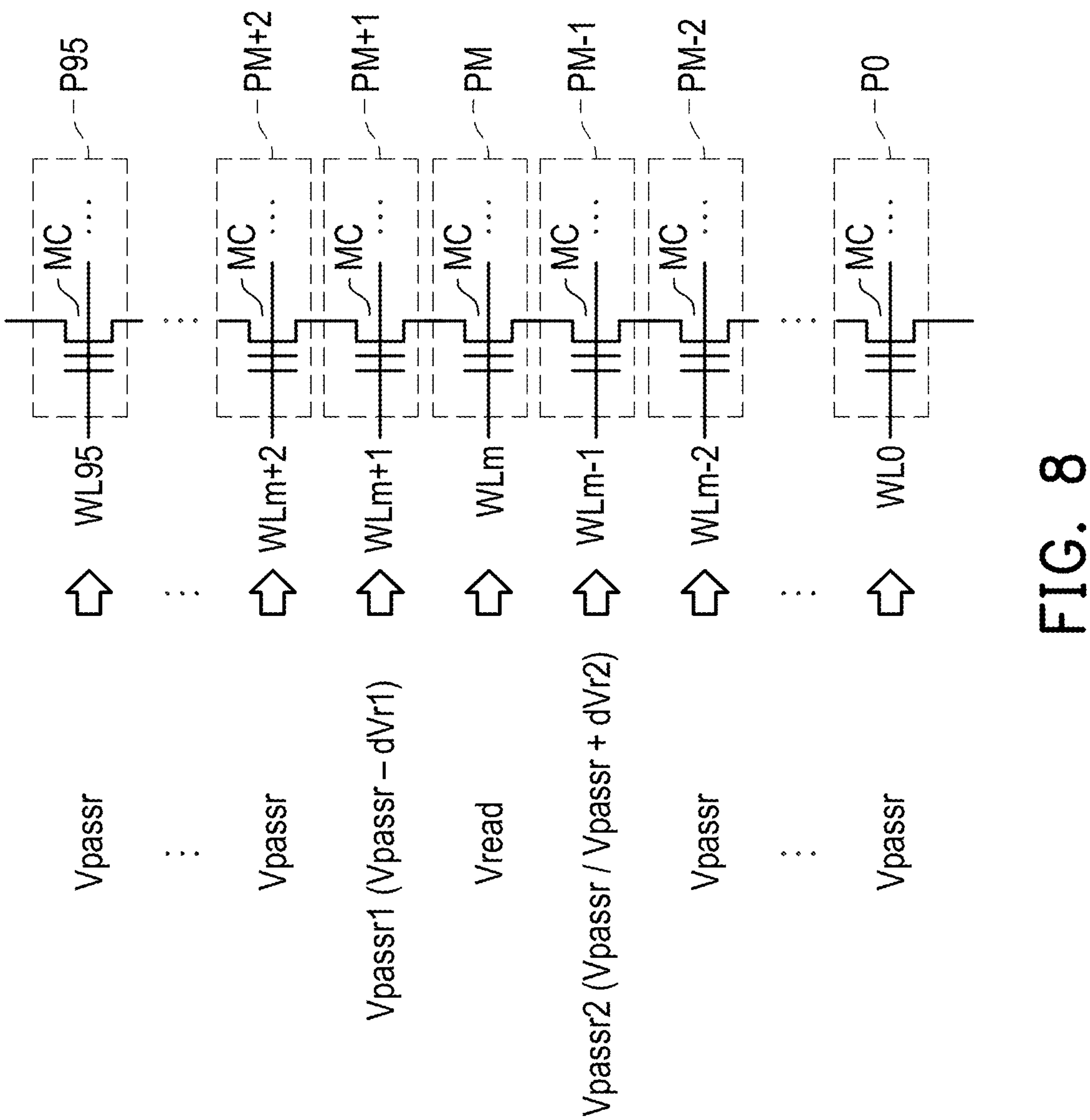
FIG. 8 is a schematic diagram showing step S720 of FIG. 7 in the second embodiment of the present disclosure.

FIG. 8 is a schematic diagram showing step S720 of FIG. 7 in the second embodiment of the present disclosure. Referring to FIG. 8, the first read pass voltage Vpassr1 is applied to the first word line WLm+1 of the first page PM+1. The first page PM+1 is adjacent to a side of the specific page PM. The second read pass voltage Vpassr2 is applied to the second word line WLm−1 of the second page PM−1. The second page PM−1 is adjacent to another side of the specific page PM. Furthermore, the read pass voltage Vpassr is applied to the word lines of other pages (e.g., pages P0 to PM−2, PM+2 to P95).

The first read pass voltage Vpassr1 in this embodiment is the voltage obtained by subtracting the first voltage difference dVr1 from the read pass voltage Vpassr. The first voltage difference dVr1 may be any voltage from 0.1V to 8V. The second read pass voltage Vpassr2 may be a voltage obtained by adding the second voltage difference dVr2 from the read pass voltage Vpassr. The second voltage difference dVr2 may be any voltage from 0.1V to 5V. Alternatively, the second read pass voltage Vpassr2 may be the read pass voltage Vpassr.

Figure 9:
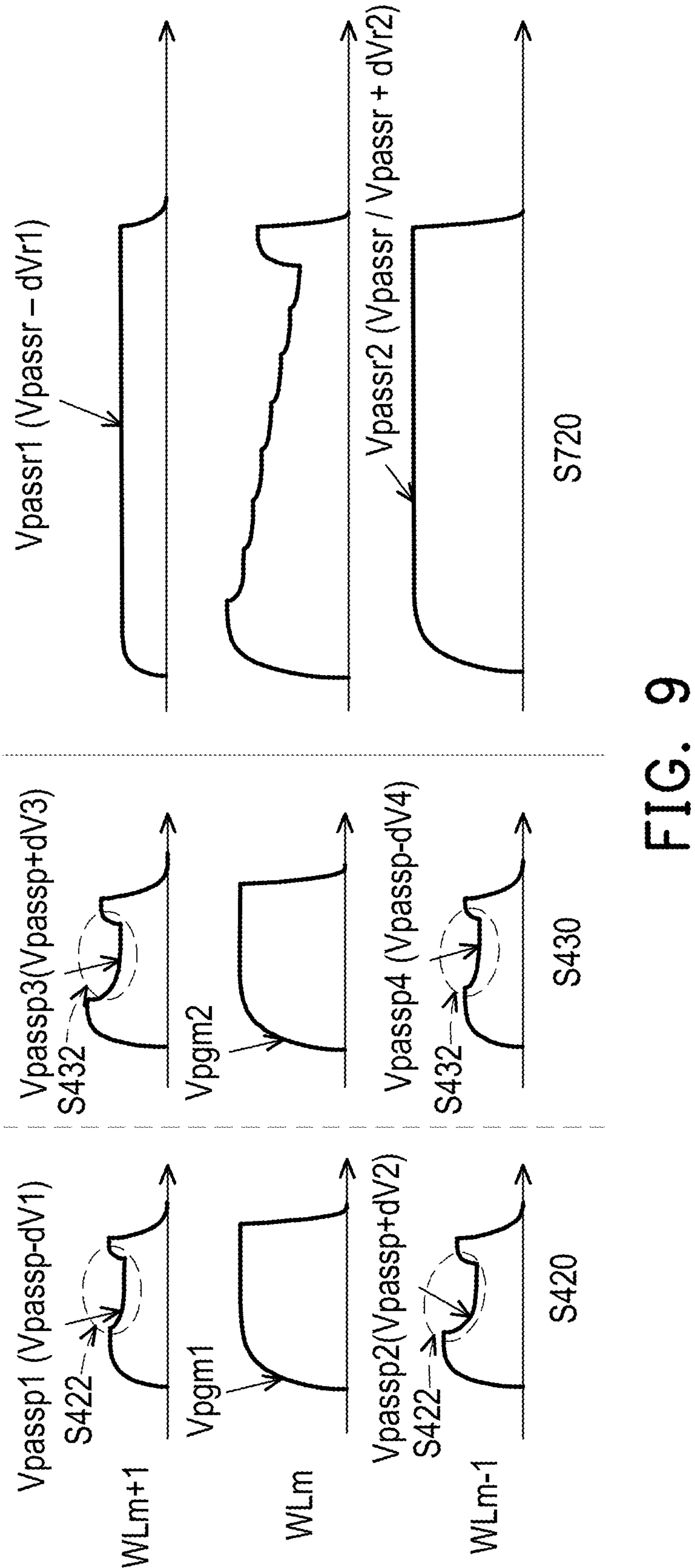
FIG. 9 is a schematic diagram of voltage waveforms applied to the plurality of word lines in FIG. 8 during the writing method and the reading method of the first embodiment and the second embodiment.

FIG. 9 is a schematic diagram of voltage waveforms applied to the plurality of word lines WLm−1, WLm and WLm+1 in FIG. 8 during the writing method and the reading method of the first embodiment and the second embodiment. FIG. 9 shows the voltage waveforms applied to the word lines WLm−1, WLm, and WLm+1 of FIG. 8 in steps S420, S430, and S720. The program voltages Vpgm1 and Vpgm2 located on the word line WLm will maintain the same potential as much as possible after increasing the potential thereof.

In the read operation of step S720, each read pass voltage located on the word lines WLm+1 and WLm−1 is maintained at the corresponding first read pass voltage Vpassr1 and second read pass voltage Vpassr2. The read voltage Vread located on the word line WLm presents voltage steps to read the hidden data through each reference voltage (for example, the sub-reference voltage Vr12 in FIG. 3 and other sub-reference voltages between adjusting potential states PS21-PS22, PS31-PS32, PS41-PS42, PS51-PS52, PS61-PS62, and PS71-PS72).

Figure 10A:
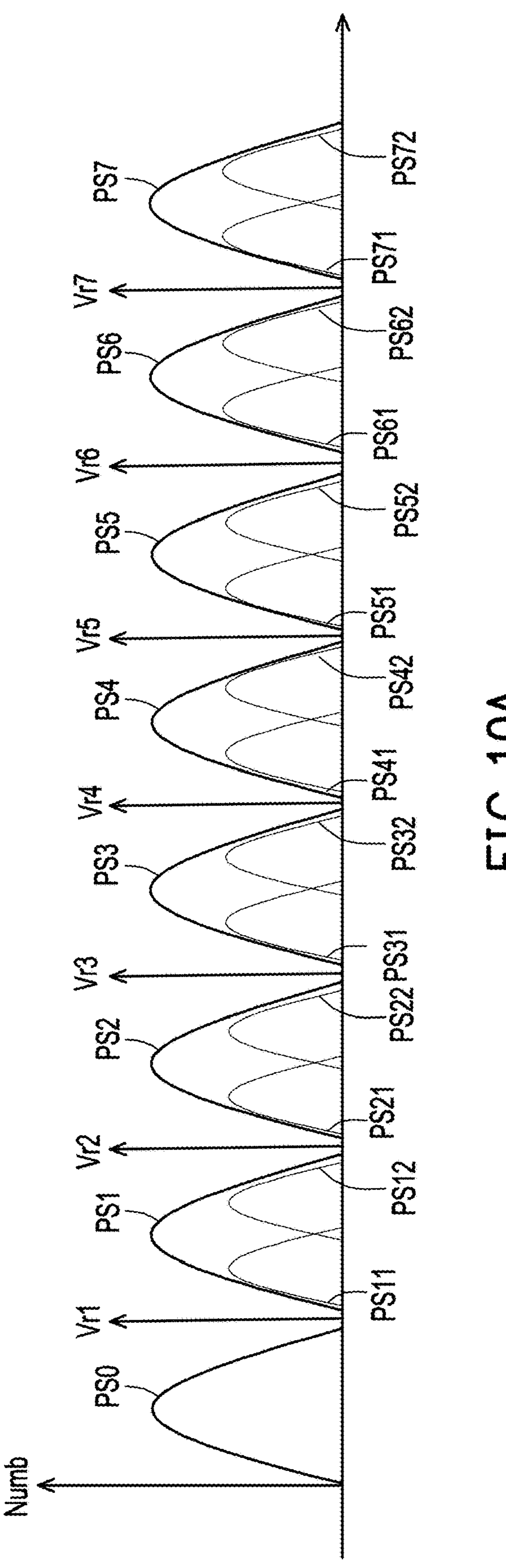
FIG. 10A and FIG. 10B are schematic diagrams illustrating each sub-potential state before and after the reading method of FIG. 7.
Figure 10B:
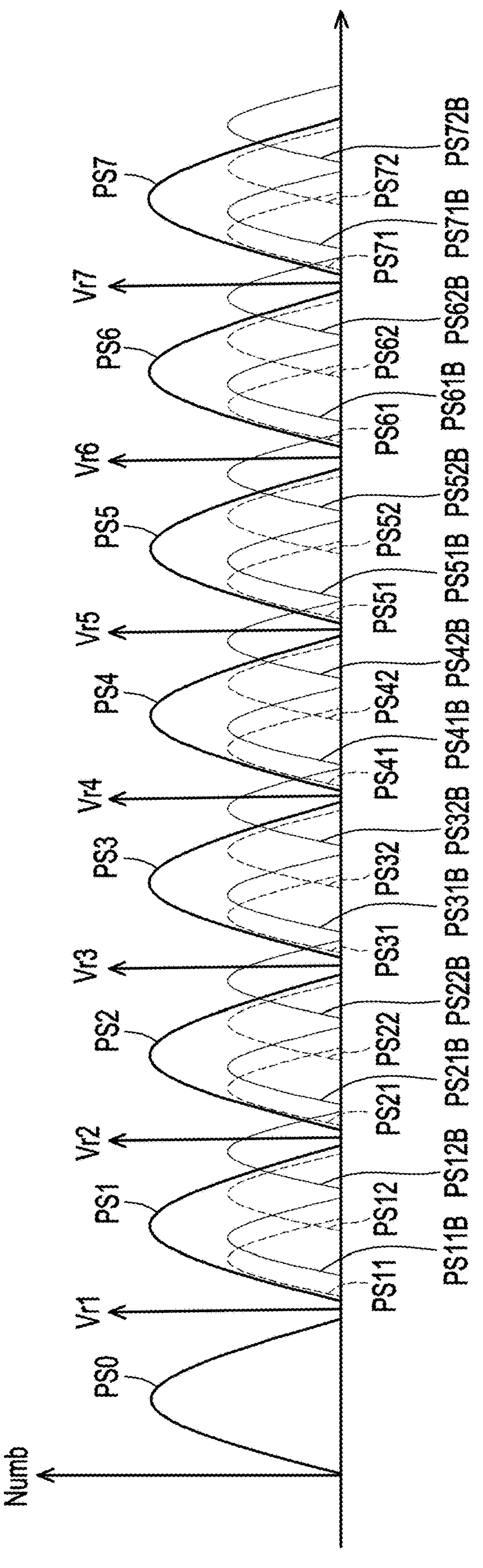

FIG. 10A and FIG. 10B are schematic diagrams illustrating each sub-potential state PS11 to PS71 and PS12 to PS72, PS11B to PS71B and PS12B to PS72B before and after the reading method of FIG. 7. FIG. 10A is mainly illustrated based on the sub-potential states PS11 and PS12 in the potential state PS1, the sub-potential states PS21 and PS22 in the potential state PS2 . . . and so on. The sub-potential states PS11 to PS71 and PS12 to PS72 of FIG. 10A present the threshold voltage distributions before the reading method of FIG. 7. After steps S722 and S724, the sub-potential states PS11 and PS12 of FIG. 10A are moved to the right and are separated to form the sub-potential states PS11B and PS12B of FIG. 10B, the sub-potential states PS21 and PS22 of FIG. 10A are moved to the right and are separated to form the sub-potential states PS21B and PS22B of FIG. 10B, and so on, the sub-potential states PS71 and PS72 of FIG. 10A are moved to the right and are separated to form the sub-potential states PS71B and PS72B of FIG. 10B. The sub-potential states PS11B to PS71B and PS12B to PS72B in FIG. 10B present the threshold voltage distributions after the reading method in FIG. 7.

It can be seen from the sub-potential states PS11 and PS12 that there is an overlapped portion between the sub-potential states PS11 and PS12 of FIG. 10A. On the other hand, the sub-potential states PS11B to PS71B and PS12B to PS72B of FIG. 10B after the reading method of FIG. 7 will make the sub-potential states PS11B to PS71B and PS12B to PS72B of FIG. 10B to be further separated from each other because of the voltage provided for the corresponding word lines PM+1 and PM−1 of the first page PM+1 and the second page PM−1 in FIG. 9, so as to reduce or even eliminate the area of the overlapped portion, thereby reducing the bit error rate when extracting the hidden data.

Figure 11A:
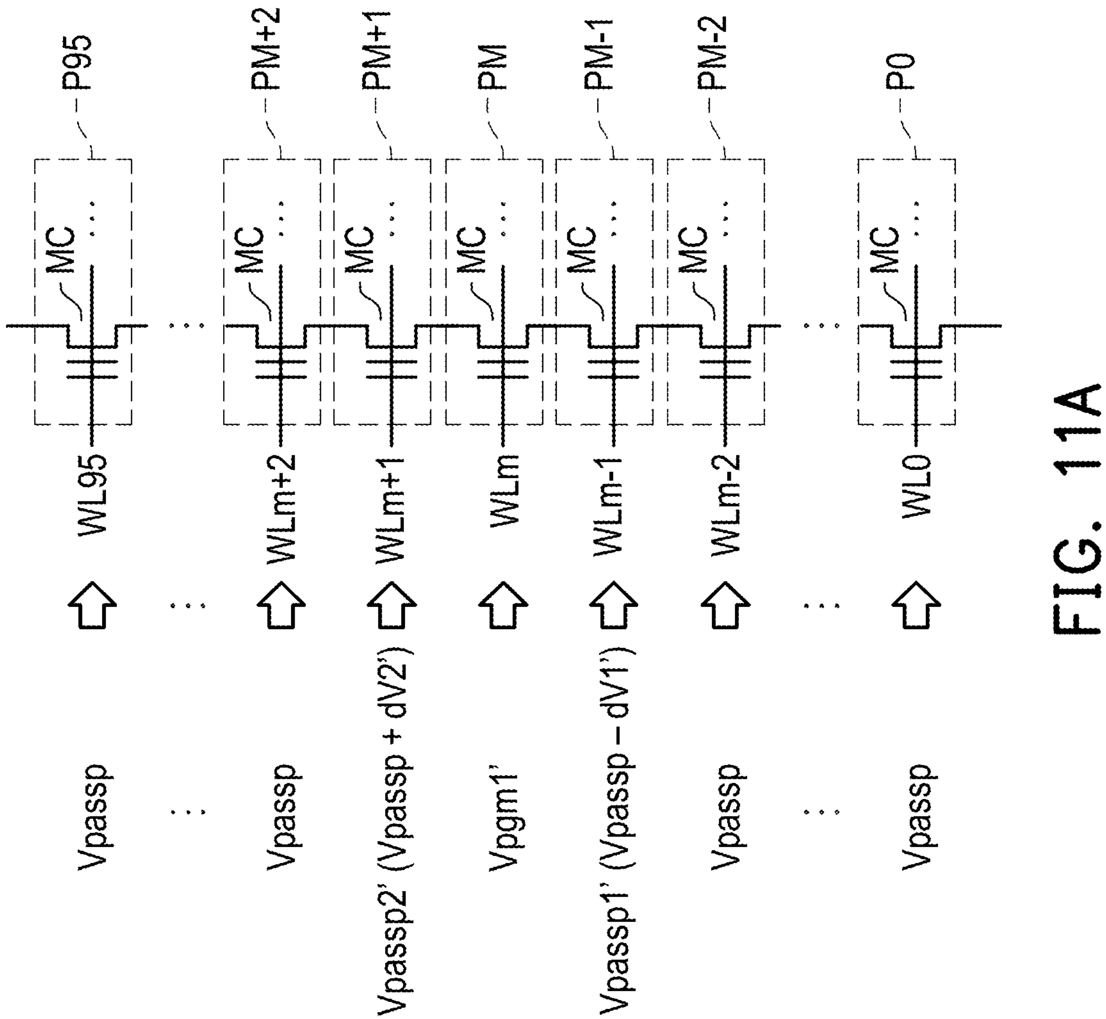
FIG. 11A and FIG. 11B are respectively schematic diagrams showing step S420 and step S430 of FIG. 4 in the third embodiment of the present disclosure.
Figure 11B:
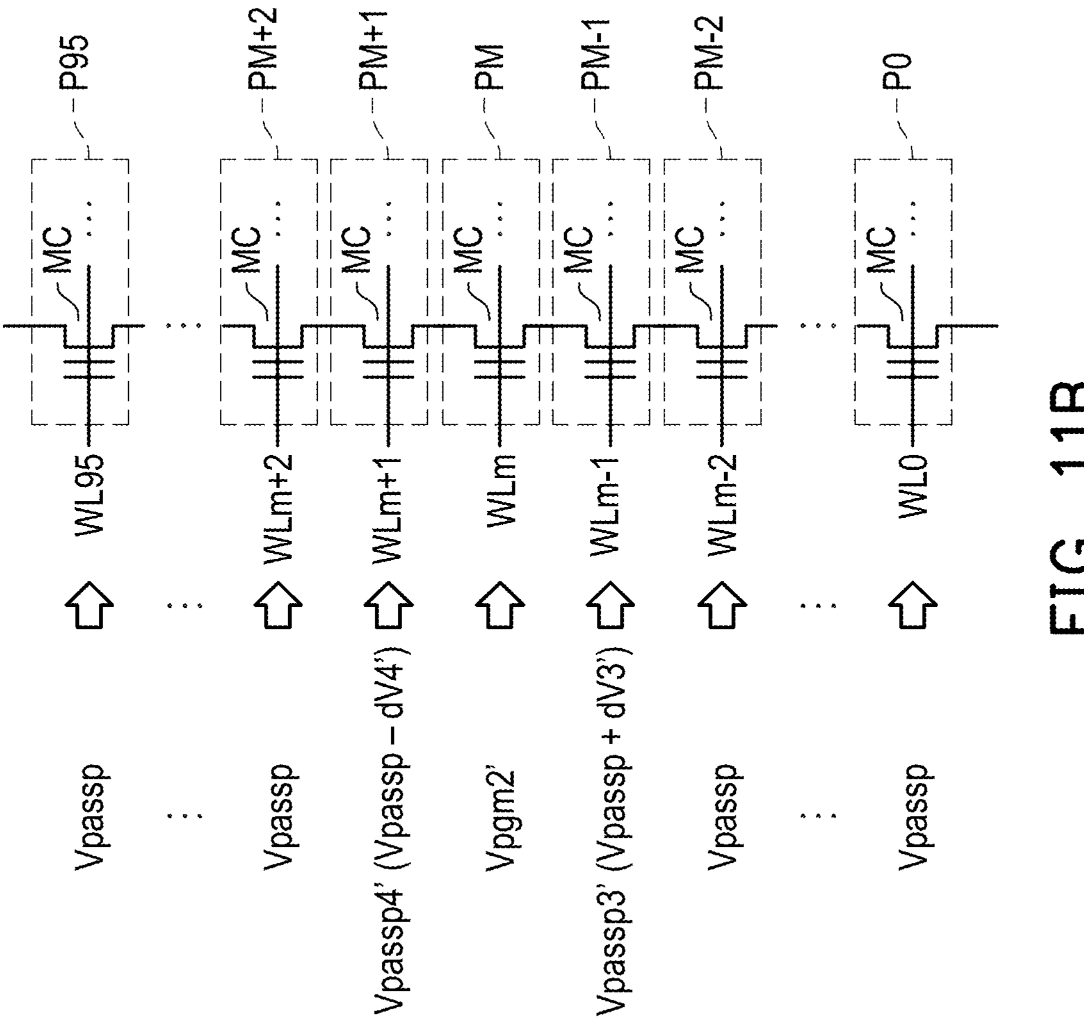

A third embodiment of the present disclosure that is similar to the first embodiment of the present disclosure is also provided here. The main difference between the two is that the first page and the second page in the first embodiment may be switched to form the third embodiment of the present disclosure. FIG. 11A and FIG. 11B are respectively schematic diagrams showing step S420 and step S430 of FIG. 4 in the third embodiment of the present disclosure.

Please refer to FIG. 11A corresponding to step S422. For a specific potential state, a first pass voltage Vpassp1' is applied to the first word line WLm−1 of the first page (e.g., page PM−1), and a second pass voltage Vpassp2' is applied to the second word line WLm+1 of the second page (e.g., page PM+1), and the first pass voltage Vpassp1' is lower than the second pass voltage Vpassp2'. The first pass voltage Vpassp1' is a voltage obtained by subtracting the first voltage difference dV1' from the pass voltage Vpassp. The second pass voltage Vpassp2' is a voltage obtained by adding the second voltage difference dV2' to the pass voltage Vpassp. In this embodiment, the first voltage difference dV1' may be any voltage between 0.1V and 10V, and the second voltage difference dV2' may be any voltage between 0.1V and 5V.

In FIG. 11A, the first program voltage Vpgm1' is also applied to the word line WLm of the specific page PM. The first program voltage Vpgm1' is set according to the first sub-potential state PS11 of the specific potential state PS1 in FIG. 3. Moreover, the pass voltage Vpassp is applied to other pages (e.g., pages P0 to PM−2, PM+2 to P95).

Please refer to FIG. 11B corresponding to step S430. For a specific potential state, a third pass voltage Vpassp3' is applied to the first word line WLm−1 of the first page (page PM−1), and a fourth pass voltage Vpassp4' is applied to the second word line WLm+1 of the second page (e.g., page PM+1), and the third pass voltage Vpassp3' is higher than the first pass voltage Vpassp1'. The fourth pass voltage Vpassp4' is lower than the third pass voltage Vpassp3'. The third pass voltage Vpassp3' is a voltage obtained by adding the third voltage difference dV3' to the pass voltage Vpassp. The fourth pass voltage Vpassp4' is the voltage obtained by subtracting the fourth voltage difference dV4' from the pass voltage Vpassp. In this embodiment, the third voltage difference dV3' is 0.1V to 5V, and the fourth voltage difference dV4' is 0.1V to 10V. In FIG. 11B, a second program voltage Vpgm2' is also applied to the word line WLm of the specific page PM. The second program voltage Vpgm2' is set according to the second sub-potential state PS12 of the specific potential state PS1 in FIG. 3. Moreover, the pass voltage Vpassp is applied to other pages (e.g., pages P0 to PM−2, PM+2 to P95).

Figure 12:
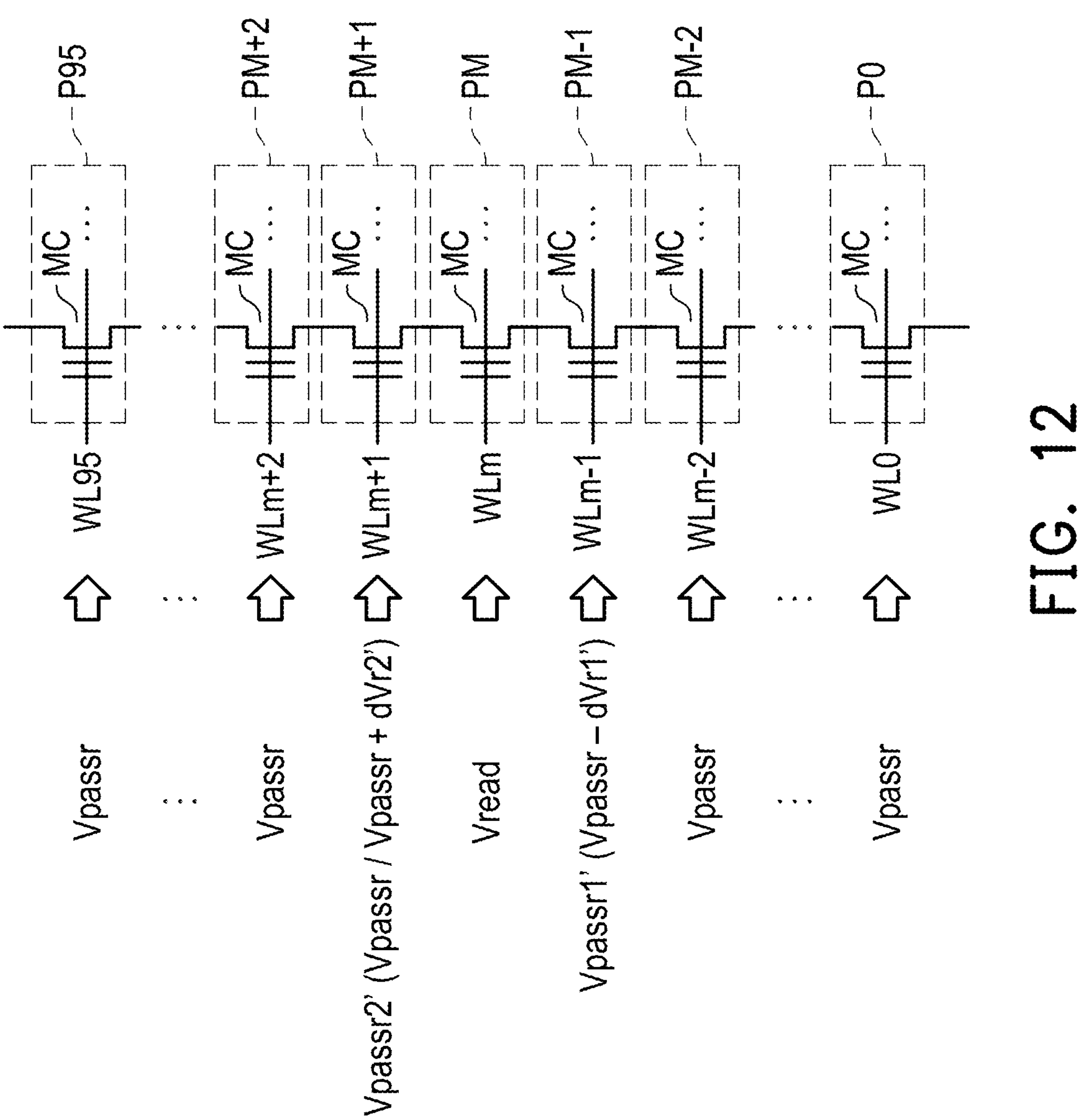
FIG. 12 is a schematic diagram showing step S720 of FIG. 7 in the fourth embodiment of the present disclosure.

A fourth embodiment similar to the second embodiment of the present disclosure is also provided here. The main difference between the two is that the first page and the second page in the second embodiment may be switched to form the fourth embodiment of the present disclosure. FIG. 12 is a schematic diagram showing step S720 of FIG. 7 in the fourth embodiment of the present disclosure. Referring to FIG. 12, a first read pass voltage Vpassr1' is applied to the first word line WLm−1 of the first page PM−1. The first page PM−1 is adjacent to a side of the specific page PM. A second read pass voltage Vpassr2' is applied to the second word line WLm+1 of the second page PM+1. The second page PM+1 is adjacent to another side of the specific page PM. Furthermore, the read pass voltage Vpassr is applied to the word lines of other pages (e.g., pages P0 to PM−2, PM+2 to P95).

The first read pass voltage Vpassr1' in this embodiment is the voltage obtained by subtracting the first voltage difference dVr1' from the read pass voltage Vpassr. The first voltage difference dVr1' may be any voltage from 0.1V to 8V. The second read pass voltage Vpassr2' may be a voltage obtained by adding the second voltage difference dVr2' from the read pass voltage Vpassr. The second voltage difference dVr2' may be any voltage from 0.1V to 5V. Alternatively, the second read pass voltage Vpassr2' may be the read pass voltage Vpassr.

Figure 13:
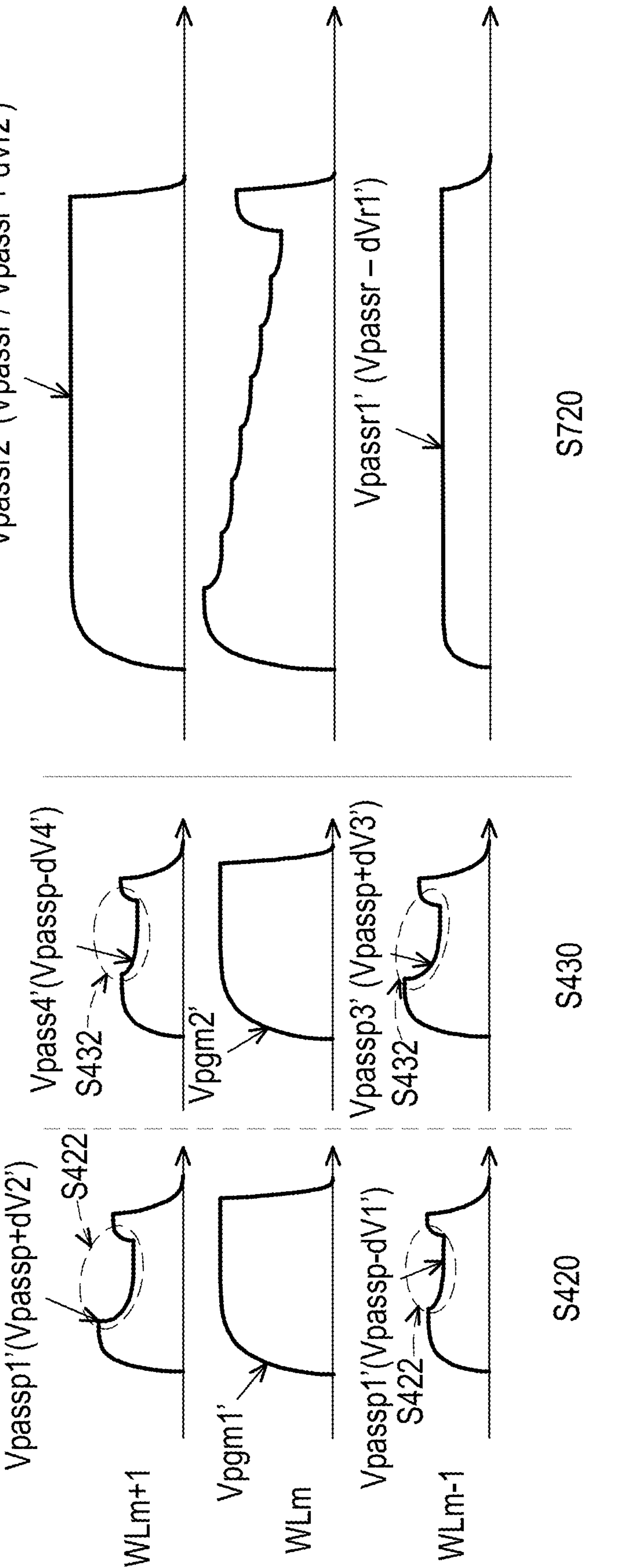
FIG. 13 is a schematic diagram of voltage waveforms applied to the plurality of word lines in FIG. 12 during the writing method and the reading method of the third embodiment and the fourth embodiment.

FIG. 13 is a schematic diagram of voltage waveforms applied to the plurality of word lines WLm−1, WLm and WLm+1 in FIG. 12 during the writing method and the reading method of the third embodiment and the fourth embodiment. FIG. 13 shows the voltage waveforms applied to the word lines WLm−1, WLm, and WLm+1 of FIG. 12 in steps S420, S430 and S720. Comparing to FIG. 9 and FIG. 13 with different embodiments, the voltages applied to the word lines WLm−1 and WLm+1 are exactly swapped. The program voltages Vpgm1' and Vpgm2' located on the word line WLm will maintain the same potential as much as possible after increasing the potential thereof.

In the read operation of step S720, each read pass voltage located on the word lines WLm−1 and WLm+1 is maintained at the corresponding first read pass voltage Vpassr1' and the second read pass voltage Vpassr2'. The read voltage Vread located on the word line WLm presents voltage steps to read the hidden data through each reference voltage (for example, the sub-reference voltage Vr12 in FIG. 3 and other sub-reference voltages between adjusting potential states PS21-PS22, PS31-PS32, PS41-PS42, PS51-PS52, PS61-PS62, and PS71-).

To sum up, according to the writing method and reading method of hiding data in a memory device and the memory device thereof in the embodiments of the present disclosure, by applying different levels of pass voltages to two pages adjacent to a specific page in the program operation of the writing method, it is possible to achieve denser threshold voltage distribution corresponding to the two sub-potential states used for hidden data in a specific potential state, thereby preventing the threshold voltage distribution corresponding to the aforementioned two sub-potential states from being exposed outside the threshold voltage distribution of a specific potential state. If the sub-potential states do not want to be overlapped, the number of the data to be hidden will be reduced, and if the number of the data to be hidden want to be maintained or increased, the sub-potential states may be overlapped. Moreover, in the reading method, by performing asymmetric read operations on two adjacent pages and the specific page, it is possible to make the aforementioned two sub-potential states further separate from each other, thereby reducing the bit error rate when extracting the hidden data.

Although the present disclosure has been disclosed above through embodiments, it is not intended to limit the present disclosure. Anyone with ordinary knowledge in the technical field can make some modifications and refinement without departing from the spirit and scope of the present disclosure. Therefore, the scope to be protected by the present disclosure shall be determined by the appended claims.

What is claimed is:

1. A writing method for hiding data in a memory device, comprising:

providing a memory block, wherein the memory block comprises a plurality of memory cells, the plurality of memory cells are respectively connected to a plurality of word lines and are constructed as a plurality of pages, wherein each of the plurality of memory cells comprises an erase state and a plurality of potential states, each of the plurality of potential states comprises a first sub-potential state and a second sub-potential state for hiding hidden data;

for a specific potential state among the plurality of potential states, performing a first program operation on a plurality of memory cells of a first portion in a specific page to move threshold voltages of the plurality of memory cells of the first portion to the first sub-potential state of the specific potential state, wherein the plurality of pages comprise the specific page; and, for the specific potential state, performing a second program operation on a plurality of memory cells of a second portion in the specific page to move threshold voltages of the plurality of memory cells of the second portion to the second sub-potential state of the specific potential state, wherein the first program operation comprises:

applying a first pass voltage to a first word line of a first page of the plurality of pages, wherein the first page is adjacent to a side of the specific page; and applying a second pass voltage to a second word line of a second page of the plurality of pages, wherein the second page is adjacent to another side of the specific page, wherein the first pass voltage is lower than the second pass voltage, wherein the second program operation comprises:

applying a third pass voltage to the first word line of the first page, wherein the third pass voltage is higher than the first pass voltage; and applying a fourth pass voltage to the second word line of the second page, wherein the fourth pass voltage is lower than the third pass voltage.

2. The writing method for hiding the data in the memory device according to claim 1, wherein the first program operation further comprises:

for the specific potential state, applying a first program voltage to a corresponding word line of the specific page, wherein the first program voltage is set according to the first sub-potential state of the specific potential state, wherein the second program operation further comprises:

for the specific potential state, applying a second program voltage to the word line of the specific page, wherein the second program voltage is set according to the second sub-potential state of the specific potential state.

3. The writing method for hiding the data in the memory device according to claim 1, further comprising:

for the specific potential state, perform a normal program operation on a plurality of memory cells of a third portion in the specific page to write publically available data to the third portion of the specific page.

4. The writing method for hiding the data in the memory device according claim 3, further comprising:

performing an erase operation on the memory block before performing the first program operation, the second program operation and the normal program operation on the specific page.

5. The writing method for hiding the data in the memory device according to claim 1, wherein the first pass voltage is a voltage obtained by subtracting a first voltage difference from a pass voltage, the second pass voltage is a voltage obtained by adding a second voltage difference to the pass voltage, the third pass voltage is a voltage obtained by adding a third voltage difference to the pass voltage, and the fourth pass voltage is a voltage obtained by subtracting a fourth voltage difference from the pass voltage.

6. The writing method for hiding the data in the memory device according to claim 5, wherein the first voltage difference is between 0.1V and 10V, the second voltage difference is between 0.1V and 5V, the third voltage difference is between 0.1V and 5V, and the fourth voltage difference is between 0.1V and 10V.

7. The writing method for hiding the data in the memory device according to claim 5, wherein the first program operation further comprises:

applying the pass voltage to a third word line of a third page of the plurality of pages, wherein the third page is different from the specific page, the first page, and the second page.

8. A memory device, comprising:

a memory array comprising a memory block, wherein the memory block comprises a plurality of memory cells, the plurality of memory cells are respectively connected to a plurality of word lines and are constructed as a plurality of pages, wherein each of the plurality of memory cells comprises an erase state and a plurality of potential states, each of the plurality of potential states comprises a first sub-potential state and a second sub-potential state for hiding hidden data; and a memory controller coupled to the memory array, wherein the memory controller is configured to:

for a specific potential state among the plurality of potential states, perform a first program operation on a plurality of memory cells of a first portion in a specific page to move threshold voltages of the plurality of memory cells of the first portion to the first sub-potential state of the specific potential state, wherein the plurality of pages comprise the specific page; and for the specific potential state, perform a second program operation on a plurality of memory cells of a second portion of the specific page to move threshold voltages of the plurality of the memory cells of the second portion to the second sub-potential state of the specific potential state, wherein the first program operation comprises:

applying a first pass voltage to a first word line of a first page of the plurality of pages, wherein the first page is adjacent to a side of the specific page; and applying a second pass voltage to a second word line of a second page of the plurality of pages, wherein the second page is adjacent to another side of the specific page, wherein the first pass voltage is lower than the second pass voltage, wherein the second program operation comprises:

applying a third pass voltage to the first word line of the first page, wherein the third pass voltage is higher than the first pass voltage; and applying a fourth pass voltage to the second word line of the second page, wherein the fourth pass voltage is lower than the third pass voltage.

9. The memory device according to claim 8, wherein the memory controller is further configured to:

wherein the first program operation further comprises:

for the specific potential state, applying a first program voltage to a corresponding word line of the specific page, wherein the first program voltage is set according to the first sub-potential state of the specific potential state, wherein the second program operation further comprises:

for the specific potential state, applying a second program voltage to the word line of the specific page, wherein the second program voltage is set according to the second sub-potential state of the specific potential state.

10. The memory device according to claim 8, wherein the memory controller is further configured to:

for the specific potential state, perform a normal program operation on a plurality of memory cells of a third portion in the specific page to write publically available data to the third portion of the specific page.

11. The memory device according to claim 10, wherein the memory controller is further configured to:

perform an erase operation on the memory block before performing the first program operation, the second program operation and the normal program operation on the specific page.

12. The memory device according to claim 8, wherein the first pass voltage is a voltage obtained by subtracting a first voltage difference from a pass voltage, the second pass voltage is a voltage obtained by adding a second voltage difference to the pass voltage, the third pass voltage is a voltage obtained by adding a third voltage difference to the pass voltage, and the fourth pass voltage is a voltage obtained by subtracting a fourth voltage difference from the pass voltage.

13. The memory device according to claim 12, wherein the first voltage difference is between 0.1V and 10V, the second voltage difference is between 0.1V and 5V, the third voltage difference is between 0.1V and 5V, and the fourth voltage difference is between 0.1V and 10V.

14. The memory device according to claim 12, wherein the memory controller is further configured to:

apply the pass voltage to a third word line of a third page of the plurality of pages, wherein the third page is different from the specific page, the first page, and the second page.

* * * * *